(12) United States Patent
Chen et al.

(10) Patent No.: US 10,865,103 B2
(45) Date of Patent: Dec. 15, 2020

(54) PACKAGING METHOD AND ASSOCIATED PACKAGING STRUCTURE

(71) Applicant: Taiwan Semiconductor Manufacturing Company Ltd., Hsinchu (TW)

(72) Inventors: Chih-Ming Chen, Hsinchu (TW); Yuan-Chih Hsieh, Hsinchu (TW); Chung-Yi Yu, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/046,651

(22) Filed: Jul. 26, 2018

(65) Prior Publication Data

US 2019/0100431 A1 Apr. 4, 2019

Related U.S. Application Data

(62) Division of application No. 15/088,130, filed on Apr. 1, 2016.

(Continued)

(51) Int. Cl.
*B81C 1/00* (2006.01)
*B81B 7/00* (2006.01)
(Continued)

(52) U.S. Cl.
CPC ............ *B81C 1/00269* (2013.01); *B81C 1/00* (2013.01); *B81C 1/00238* (2013.01);
(Continued)

(58) Field of Classification Search
CPC .............. B81C 1/0023; B81C 1/00285; B81C 2203/0785; B81C 2203/019;
(Continued)

(56) References Cited

U.S. PATENT DOCUMENTS

| 7,075,160 B2 * | 7/2006 | Partridge | ............ | B81C 1/00301 |
| | | | | 257/414 |
| 7,104,129 B2 * | 9/2006 | Nasiri | .................... | B81C 1/0023 |
| | | | | 73/504.04 |

(Continued)

FOREIGN PATENT DOCUMENTS

| CN | 103178204 | 2/2016 |
| TW | 201526205 | 7/2015 |

*Primary Examiner* — Mary A Wilczewski
*Assistant Examiner* — Tsz K Chiu
(74) *Attorney, Agent, or Firm* — Haynes and Boone, LLP

(57) ABSTRACT

The present disclosure provides a packaging method, including: providing a first semiconductor substrate; forming a bonding region on the first semiconductor substrate, wherein the bonding region of the first semiconductor substrate includes a first bonding metal layer and a second bonding metal layer; providing a second semiconductor substrate having a bonding region, wherein the bonding region of the second semiconductor substrate includes a third bonding layer; and bonding the first semiconductor substrate to the second semiconductor substrate by bringing the bonding region of the first semiconductor substrate in contact with the bonding region of the second semiconductor substrate; wherein the first and third bonding metal layers include copper (Cu), and the second bonding metal layer includes Tin (Sn). An associated packaging structure is also disclosed.

20 Claims, 13 Drawing Sheets

Related U.S. Application Data

(60) Provisional application No. 62/273,750, filed on Dec. 31, 2015.

(51) Int. Cl.
*H01L 23/488* (2006.01)
*H01L 25/00* (2006.01)

(52) U.S. Cl.
CPC ............ *H01L 23/488* (2013.01); *H01L 25/50* (2013.01); *B81B 2201/0235* (2013.01); *B81B 2201/0242* (2013.01); *B81B 2201/0264* (2013.01); *B81B 2207/012* (2013.01); *B81B 2207/093* (2013.01); *B81C 2201/019* (2013.01); *B81C 2201/0132* (2013.01); *B81C 2203/0118* (2013.01); *B81C 2203/035* (2013.01); *B81C 2203/036* (2013.01)

(58) Field of Classification Search
CPC .......... B81C 2203/035; B81C 1/00269; B81C 1/00238; B81C 2203/0118; B81C 2201/019; B81C 2203/036; B81C 1/00261; B81C 2203/01; B81B 7/0038; B81B 7/02; B81B 7/0041; B81B 2207/017; B81B 2201/0228
See application file for complete search history.

(56) References Cited

U.S. PATENT DOCUMENTS

| | | | |
|---|---|---|---|
| 7,442,570 B2 * | 10/2008 | Nasiri | B81C 1/00238 438/48 |
| 8,987,059 B2 | 3/2015 | Liang et al. | |
| 9,040,334 B2 | 5/2015 | Chu et al. | |
| 9,065,358 B2 | 6/2015 | Tsai et al. | |
| 9,067,779 B1 * | 6/2015 | Rothberg | B81B 7/007 |
| 9,085,455 B2 | 7/2015 | Cheng et al. | |
| 9,085,456 B2 | 7/2015 | Tsai et al. | |
| 9,122,827 B2 | 9/2015 | Chen et al. | |
| 9,133,017 B2 | 9/2015 | Liang et al. | |
| 9,138,994 B2 | 9/2015 | Peng et al. | |
| 9,139,420 B2 | 9/2015 | Chang et al. | |
| 9,139,423 B2 | 9/2015 | Chien et al. | |
| 9,181,083 B2 | 11/2015 | Tsai et al. | |
| 9,187,317 B2 | 11/2015 | Cheng et al. | |
| 9,233,839 B2 | 1/2016 | Liu et al. | |
| 9,236,877 B2 | 1/2016 | Peng et al. | |
| 9,238,581 B2 | 1/2016 | Wu et al. | |
| 9,344,808 B2 * | 5/2016 | Chan | H04R 19/005 |
| 9,394,161 B2 * | 7/2016 | Cheng | B81B 7/007 |
| 9,809,450 B2 * | 11/2017 | Shin | B81B 7/0006 |
| 10,029,911 B2 * | 7/2018 | Breitling | B81B 7/02 |
| 10,221,065 B2 * | 3/2019 | Lee | B81B 7/02 |
| 10,273,147 B2 * | 4/2019 | Boysel | B81B 7/007 |
| 10,413,992 B2 * | 9/2019 | Ishino | B23K 35/3613 |
| 2004/0077117 A1 * | 4/2004 | Ding | B81B 7/007 438/51 |
| 2004/0166385 A1 * | 8/2004 | Morse | H01M 8/04216 429/421 |
| 2005/0170656 A1 * | 8/2005 | Nasiri | B81C 1/00238 438/700 |
| 2006/0208326 A1 * | 9/2006 | Nasiri | B81C 1/00238 257/414 |
| 2009/0294879 A1 * | 12/2009 | Bhagavat | B81C 1/00269 257/415 |
| 2010/0025845 A1 * | 2/2010 | Merz | B81B 7/0038 257/723 |
| 2011/0121412 A1 * | 5/2011 | Quevy | B81B 7/02 257/415 |
| 2012/0043627 A1 * | 2/2012 | Lin | B81B 7/02 257/415 |
| 2012/0326248 A1 * | 12/2012 | Daneman | B81C 1/0023 257/415 |
| 2014/0225206 A1 * | 8/2014 | Lin | B81B 7/0038 257/417 |
| 2014/0287548 A1 | 9/2014 | Lin et al. | |
| 2015/0129991 A1 * | 5/2015 | Lee | B81B 7/0038 257/415 |
| 2015/0137303 A1 | 5/2015 | Chou et al. | |
| 2015/0175405 A1 | 6/2015 | Cheng | |
| 2015/0175407 A1 | 6/2015 | Cheng et al. | |
| 2015/0196912 A1 | 7/2015 | Tsai et al. | |
| 2015/0360939 A1 * | 12/2015 | Zhang | B81C 1/00246 438/51 |

* cited by examiner

PACKAGING METHOD AND ASSOCIATED PACKAGING STRUCTURE

PRIORITY CLAIM AND CROSS-REFERENCE

This application is a divisional application of U.S. patent application Ser. No. 15/088,130, filed Apr. 1, 2016, which claims the benefit of U.S. provisional application No. 62/273,750, filed on Dec. 31, 2015, each of which are incorporated by reference in their entirety.

BACKGROUND

In the Micro-Electro-Mechanical Systems (MEMS) and micro-electronic fields there is frequently a need for bonding wafers together for the purpose of encapsulating structures in vacuum cavities or in cavities with controlled atmosphere. Such structures may have to be operable during very long times, most often tens of years. It can also be desirable to provide electrical connection between wafers via the sealing.

It is of course absolutely necessary that the joints that holds/bonds the wafers together and that provides the actual sealing of said cavities will provide good enough sealing that will not deteriorate over time. Eutectic bonding is one of popular means for bonding. However, as the modern semiconductor structure becomes more and more delicate, the overall thermal budget becomes tight so that a bonding temperature of the existing eutectic bonding materials becomes unacceptable. In particular, a pressing force applied during the eutectic bonding process also decreases along with evolving of the advanced process, such as MEMS structures.

Therefore, a novel bonding mechanism to fulfill the aforementioned issues has become an urgent need in fields pertinent to semiconductor manufacturing industry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
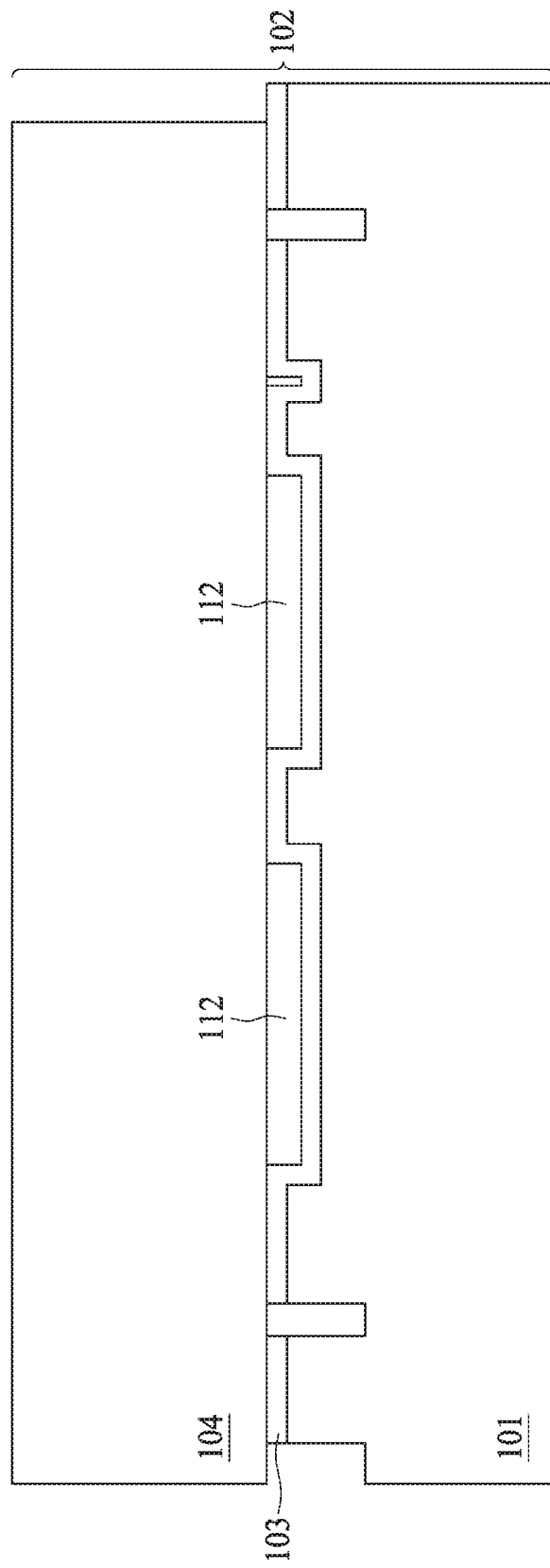
FIGS. 1-11 are a series of cross-sectional views illustrating processing steps to fabricate a CMOS-MEMS device structure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present invention relates generally to bonding, particular to eutectic bonding. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

In the described embodiments, Micro-Electro-Mechanical Systems (MEMS) refers to a class of structures or devices fabricated using semiconductor-like processes and exhibiting mechanical characteristics such as the ability to move or deform. MEMS often, but not always, interact with electrical signals. MEMS devices include, but are not limited to, gyroscopes, accelerometers, magnetometers, pressure sensors, and radio-frequency components. In some embodiments, a MEMs device structure may include a plurality of the aforesaid MEMs devices. Silicon wafers containing a MEMS device or a MEMS device structure are referred to as MEMS wafers.

In the described embodiments, MEMS device may refer to a semiconductor device implemented as a micro-electro-mechanical system. A MEMS device structure may refer to any feature associated with an assembly of a plurality of MEM S devices. An engineered silicon-on-insulator (ESOI) wafer may refer to a SOI wafer with cavities beneath the silicon device layer or substrate. Cap or handle wafer typically refers to a thicker substrate used as a carrier for the thinner silicon sensing substrate in a silicon-on-insulator wafer. Cap or handle substrate and cap or handle wafer can be interchanged. In the described embodiments, a cavity may refer to an opening or recession in a substrate wafer and enclosure may refer to a fully enclosed space.

To describe the features of the invention in more detail, apparatus and fabrication methods to achieve a MEMS device with features including improved bonding temperature and pressing force applied during bonding are disclosed.

FIGS. 1-11 are a series of cross-sectional views illustrating processing steps to fabricate a MEMS device assembly, or a MEMS device, according to an embodiment of the present disclosure. In FIG. 1, a sensing substrate 104 and a cap substrate 101 are bonded together with a thin dielectric film 103 therebetween to form an ESOI substrate 102. Please note that in the exemplary embodiment of the present disclosure, the sensing substrate 104 and the cap substrate 101 are bonded together by fusion bonding at relatively high processing temperatures, which enables more complete removal of chemical species from the dielectric materials in the substrates prior to sealing cavities of the MEMS structures. Both substrates are annealed during bonding, which reduces outgassing of chemical species during the cavity formation process. The MEMS structures bonded by fusion bonding are mechanically stronger compared to metal bonding due to a higher bonding ratio. In addition, fusion bonding enables the formation of through substrate vias (TSVs) in the MEMS structures without degrading yield. However, the concept of the present disclosure is not limited thereto. One of ordinary skill in the art would recognize many variations, modifications, and alternatives. The concept of the present disclosure may be also applied to other types of MEMS device assembly in some embodiments.

The thin dielectric film 103 includes materials such as silicon oxide or other insulating layer. Along with a surface of the cap substrate 101, a plurality of cavities 112 of desired sizes are defined and patterned on through isotropic etching, for example, but this is not a limitation of the present disclosure. One of ordinary skill in the art would recognize many variations, modifications, and alternatives. The plurality of cavities 112 are utilized to accommodate an adjacent movable proof mass of a MEMS device to be fabricated. The size of each cavity 112 may be determined according to the movable proof mass and/or desired performance of the MEMS device. In some embodiments, each cavity 112 may be of different depth or dimension than the other cavities.

Figure 2:
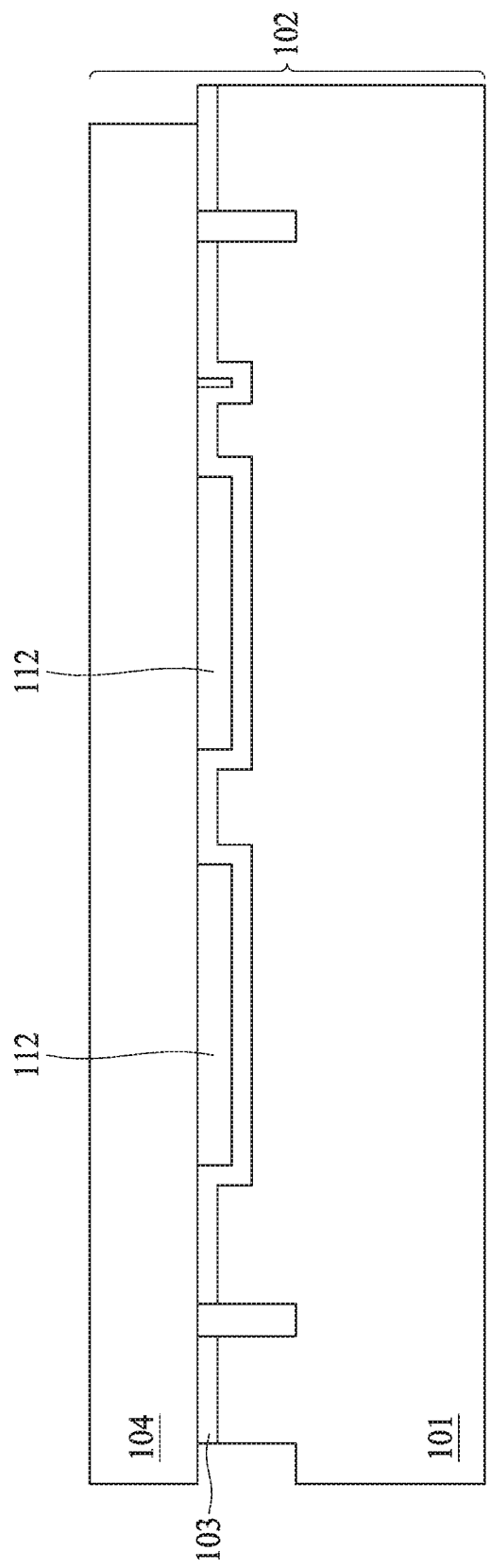

The sensing substrate 104 is then thinned using a grinding and/or other thinning process to achieve the desired thickness as illustrated in FIG. 2. Existing thinning techniques like Chemical Mechanical Planarization (CMP) and/or Reactive Ion Etching (RIE) can be used to achieve the desired thickness. Suitable grinding and polishing equipments may be used for the thinning process. One of ordinary skill in the art would recognize many variations, modifications, and alternatives. In some other embodiments, an etch stop layer is integrated into sensing substrate 104 in order to facilitate precision control of the thinning process. One of ordinary skill in the art would recognize many variations, modifications, and alternatives.

Figure 3:
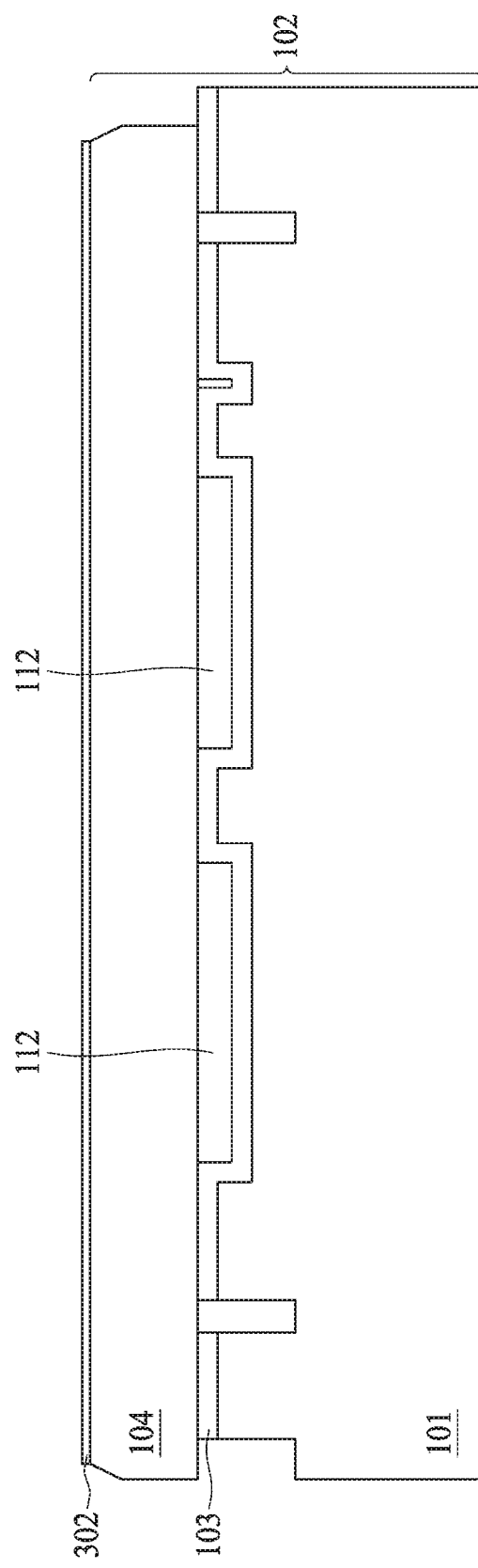
Figure 4:
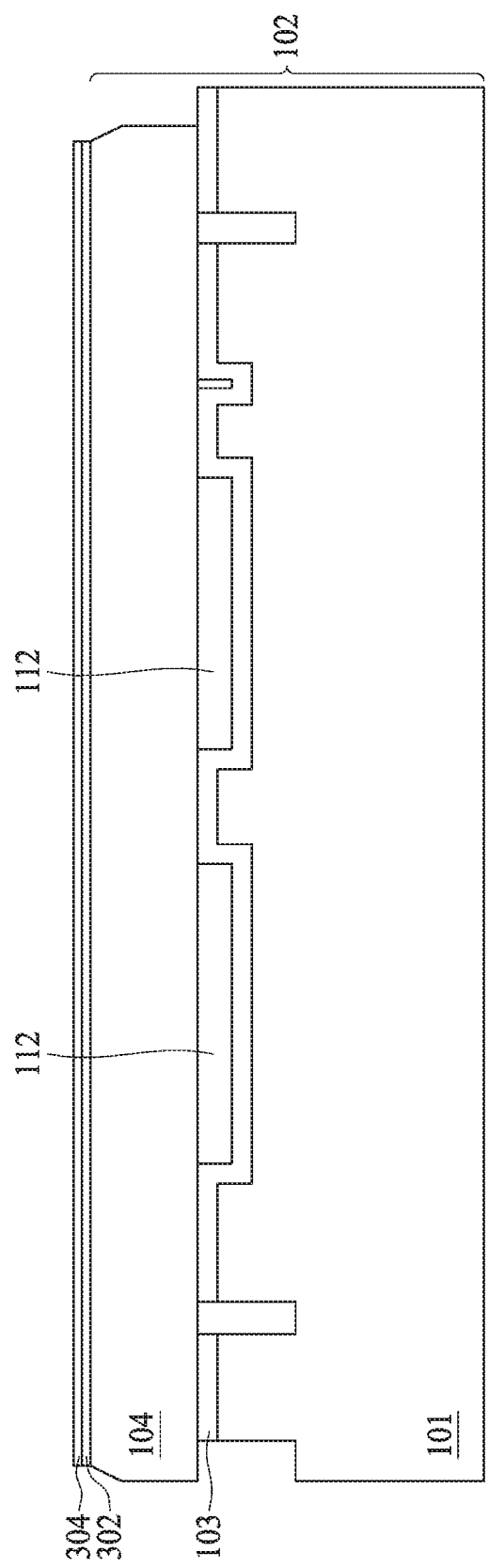

Referring to FIG. 3, a metal layer 302 is then deposited on the sensing substrate 104. In this embodiment, the metal layer 302 includes a copper (Cu) layer. In particular, the metal layer 302 includes a thin titanium (Ti) layer beneath the Cu layer. In some embodiments, the metal layer 302 is deposited using electroplating, physical vapor deposition (PVD), or a Chemical Vapor Deposition (CVD) process. One of ordinary skill in the art would recognize many variations, modifications, and alternatives. Referring to FIG. 4, another metal layer 304 different from the metal layer 302 is then deposited on the metal layer 302. In this embodiment, the metal layer 304 includes a tin (Sn) layer. In some embodiments, the metal layer 304 is deposited using electroplating, physical vapor deposition (PVD), or a Chemical Vapor Deposition (CVD) process. One of ordinary skill in the art would recognize many variations, modifications, and alternatives.

Figure 5:
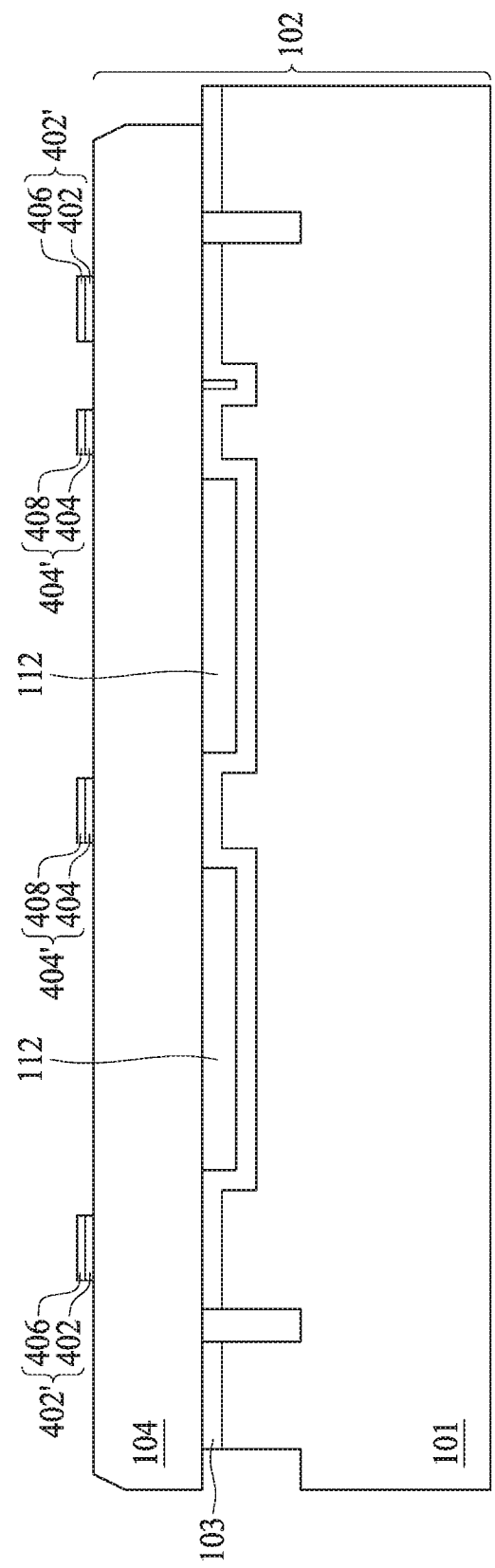

The next step shown in FIG. 5 is to pattern and etch the metal layers 302 and 304 according to a structure of the MEMS device to be produced. As a consequence of the pattern and etch operation, a plurality of bonding regions 402' and 404' are formed for bonding in following steps, such as eutectic bonding being employed in the exemplary embodiment. In particular, each bonding region 402' includes metal layers 402 and 406; and each bonding region 404' includes metal layers 404 and 408, wherein the metal layers 406 and 408 are regarded as ancillary bonding metal layers during the bonding operation to form eutectic bond.

For purposes of clarity, a photolithography process in which a photoresist layer is deposited on the metal layer 304 and patterned to form an etch mask is not shown in this process flow. The dimensions of the etch mask may be tightly controlled during photolithography and the etch mask may be formed from any suitable material that is resistant to the etching process used to etch the metal layers. In some embodiments, an etch mask of Silicon Nitride (Si3N4) utilized. In some other embodiments, a photoresist layer can serve as the etch mask. One of ordinary skill in the art would recognize many variations, modifications, and alternatives. Although a one dimensional cross section is illustrated in FIG. 5, it will be evident to one of skill in the art that a two-dimensional pattern of the desired geometry is formed in the metal layers 302 and 304. In some embodiments, the bonding regions 402' and 404' may further comprise nickel (Ni), germanium (Ge), aluminum (Al). In other embodiments, other materials such as gold (Au), indium (In), or other solders having good adhesion underlying layers and improved wetting capability may be used for the bonding regions.

Figure 6:
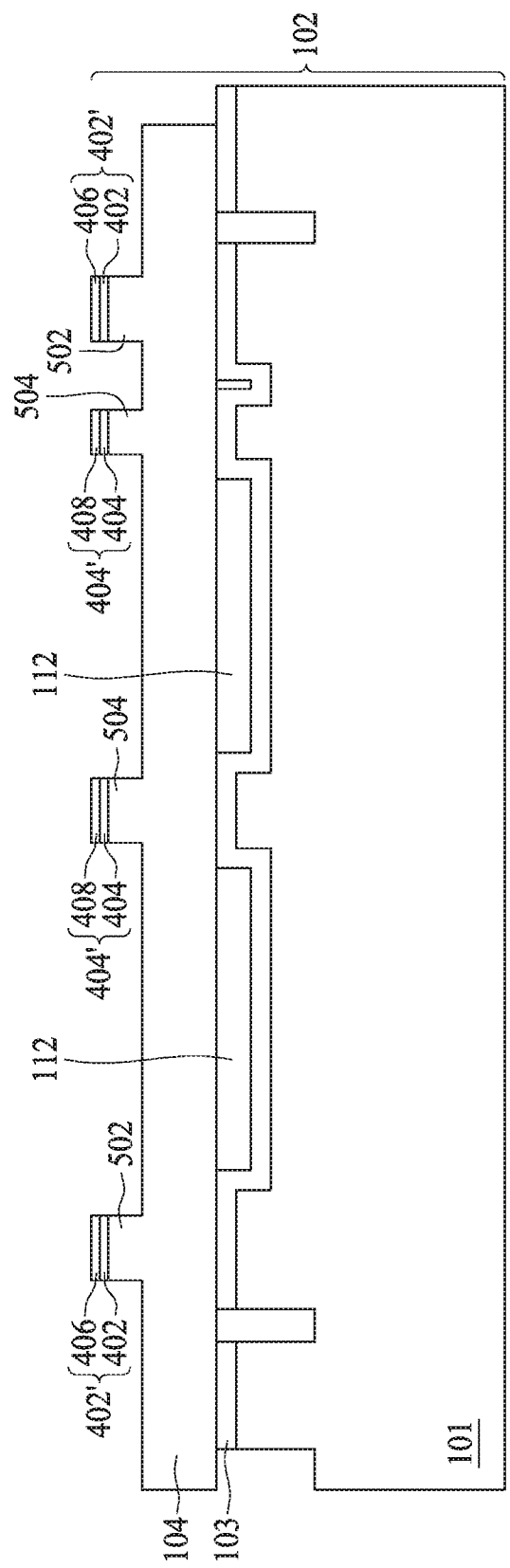

A first shallow cavity etch is performed selectively to the sensing substrate 104. During the first shallow cavity etch, shallow cavities are formed to reach a certain depth measured from a surface of the sensing substrate 104 of FIG. 5. After the first shallow cavity etch, a plurality of first step bonding mesas 502 and 504 are left and protruding from an etched surface of the sensing substrate 104 as can be seen in FIG. 6. To be more specific, the plurality of first step bonding mesas 502 and 504 are located beneath the bonding regions 402' and 404'. The plurality of first step bonding mesas 502 and 504 carry the conductive bonding regions 402' and 404' to form a stack structure. In the exemplary embodiment, the width of the plurality of first step bonding mesas 502 and 504 may be substantially equal or wider than the bonding regions 402' and 404'. The side walls of the plurality of first step bonding mesas 502 and 504 may be vertical or tapered. One of ordinary skill in the art would recognize many variations, modifications, and alternatives.

Figure 7:
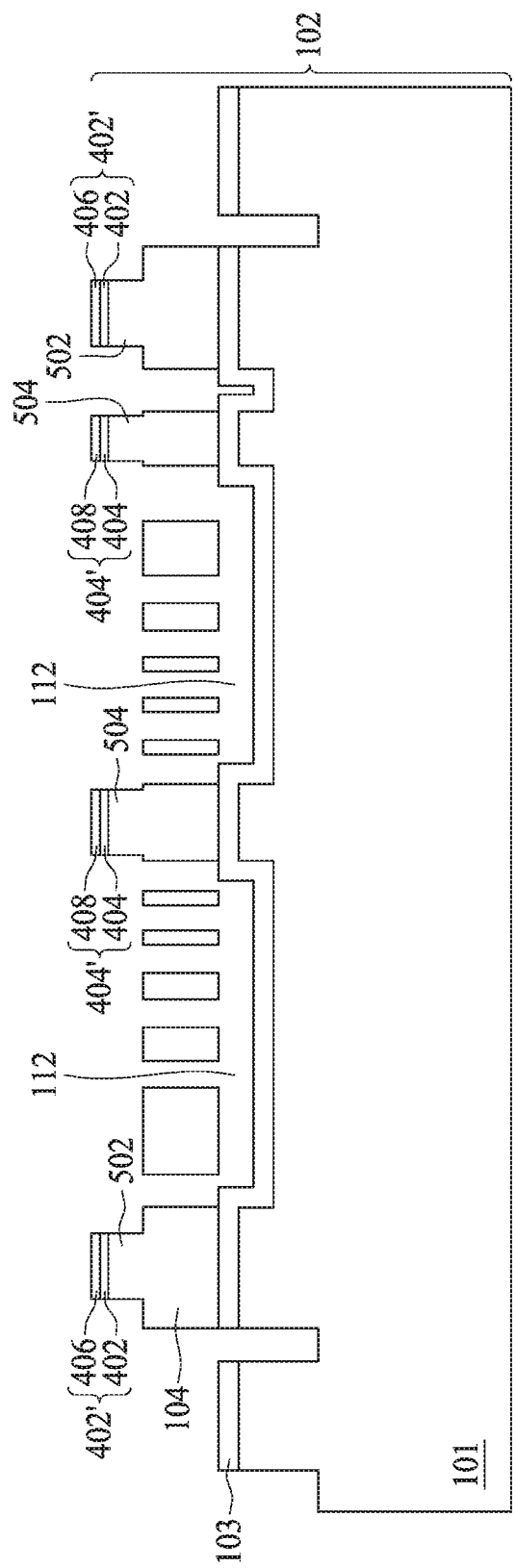

The sensing substrate 104 is then patterned and etched to form the sensing substrate as illustrated in FIG. 7. The sensing substrate includes a proof-mass, balanced or unbalanced, suspended by at least one spring or elastic device and free to move in at least one of the x-, y-, and z-directions, with at least one electrode embedded in the at least one spring or elastic device. The at least one spring or elastic device is attached to a support structure, which is attached to the sensing substrate 104. The proof-mass, support structure, and at least one electrode are fabricated in the same semiconductor layers as the drive/sense circuitry. In some embodiments, the at least one spring or elastic device and the support structure form a network of supports. The proof-mass, suspended by the network of supports, is free to move in any direction. The MEMS capacitively senses or produces movement of the proof-mass in any direction. In some embodiments, the direction can include a direction along at least one of the x-, y-, and z-directions.

In some embodiments, the patterning and etching techniques used to form the sensing substrate may vary depending on the type of the MEMS device. For example, the patterning and etching for a MEMS accelerometer is different from the patterning and etching used for a MEMS gyroscope. Existing etching techniques like anisotropic etching, RIE, or the like may be used. In some embodiments, the thickness of the sensing substrate 104 can vary as a function of position along the length of the sensing substrate, where the length is defined along a direction orthogonal to the thickness of the substrate. For example, the sensing substrate 104 may have a first thickness at one end, a second thickness in the center, and a third thickness at the other end.

Figure 8A:
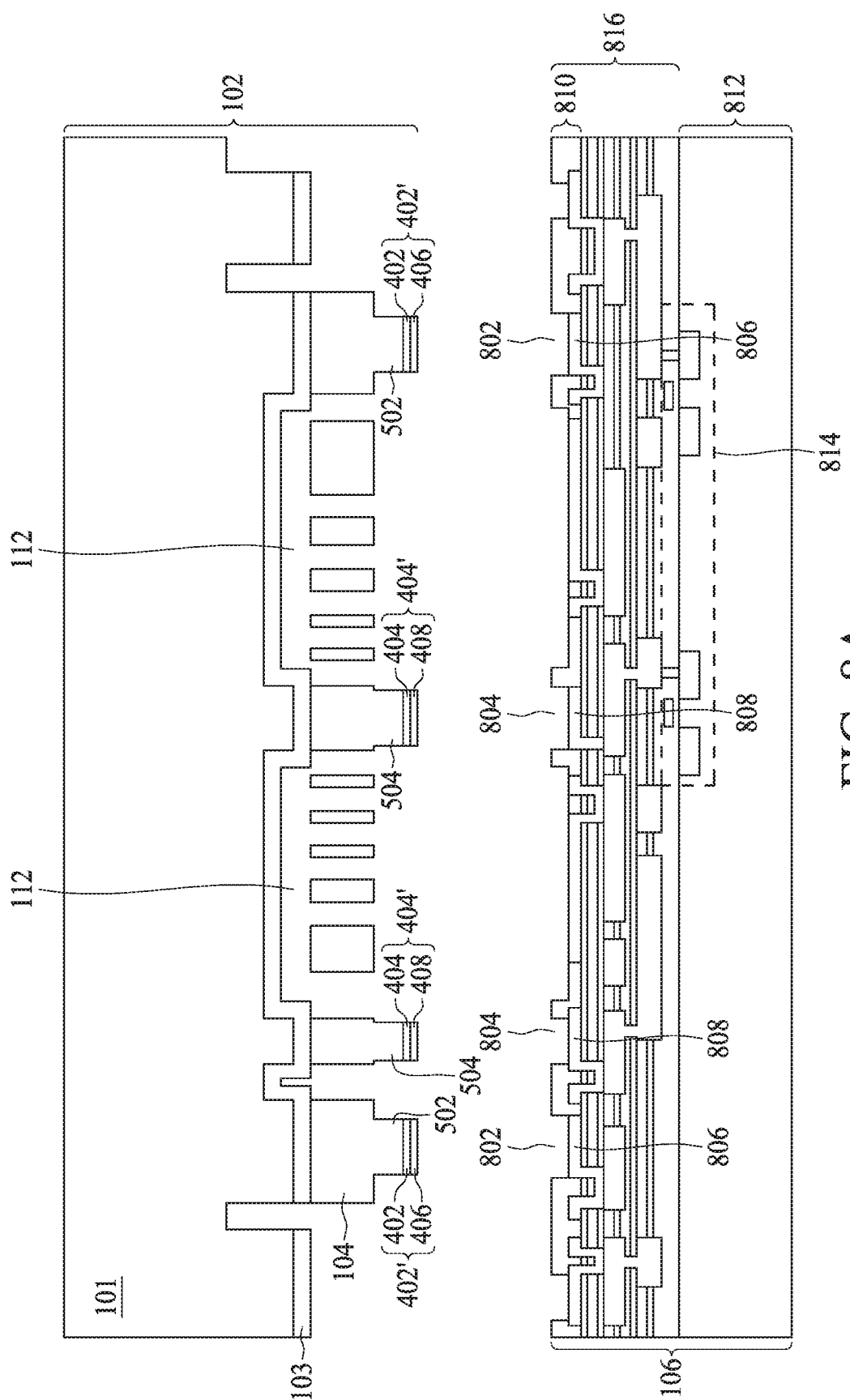

Next, as illustrated in FIG. 8A, the ESOI substrate 102 and a complementary metal-oxide semiconductor (CMOS) wafer 106 are pre cleaned and then aligned prior to eutectic bonding. In the present disclosure, a CMOS wafer can be termed as a CMOS substrate. The CMOS wafer 106 may include a substrate 812. The substrate 812 may comprise a semiconductor material such as silicon, although other semiconductor materials may be used. A plurality of CMOS devices 814 (such as transistors) is formed at a surface of substrate 812. Furthermore, an interconnect structure 816 is formed to electrically couple to the CMOS devices 814. The interconnect structure 816 may include dielectric layers, which further include low-k dielectric layers, non-low-k dielectric layers such as passivation layers, and the like. Metal lines and vias, which may be formed of copper, aluminum, and combinations thereof, are formed in the dielectric layers.

A top dielectric layer 810 of the interconnect structure 816 is patterned, and a plurality of openings, including openings 802 and 804 corresponding to the bonding regions 402' and 404', are formed in the top dielectric layer 810. As a result, bonding regions 806 and 808 are exposed. The dielectric layer 810 has a different melting characteristic compared to a bonding metal of a plurality of bonding regions 806 and 808 of the CMOS substrate 106. In the exemplary embodiment, the bonding regions 806 and 808 include a Cu layer. In particular, the bonding regions 806 and 808 further include a thin Ti layer beneath the Cu layer. However, this is not a limitation of the present invention.

Figure 8B:
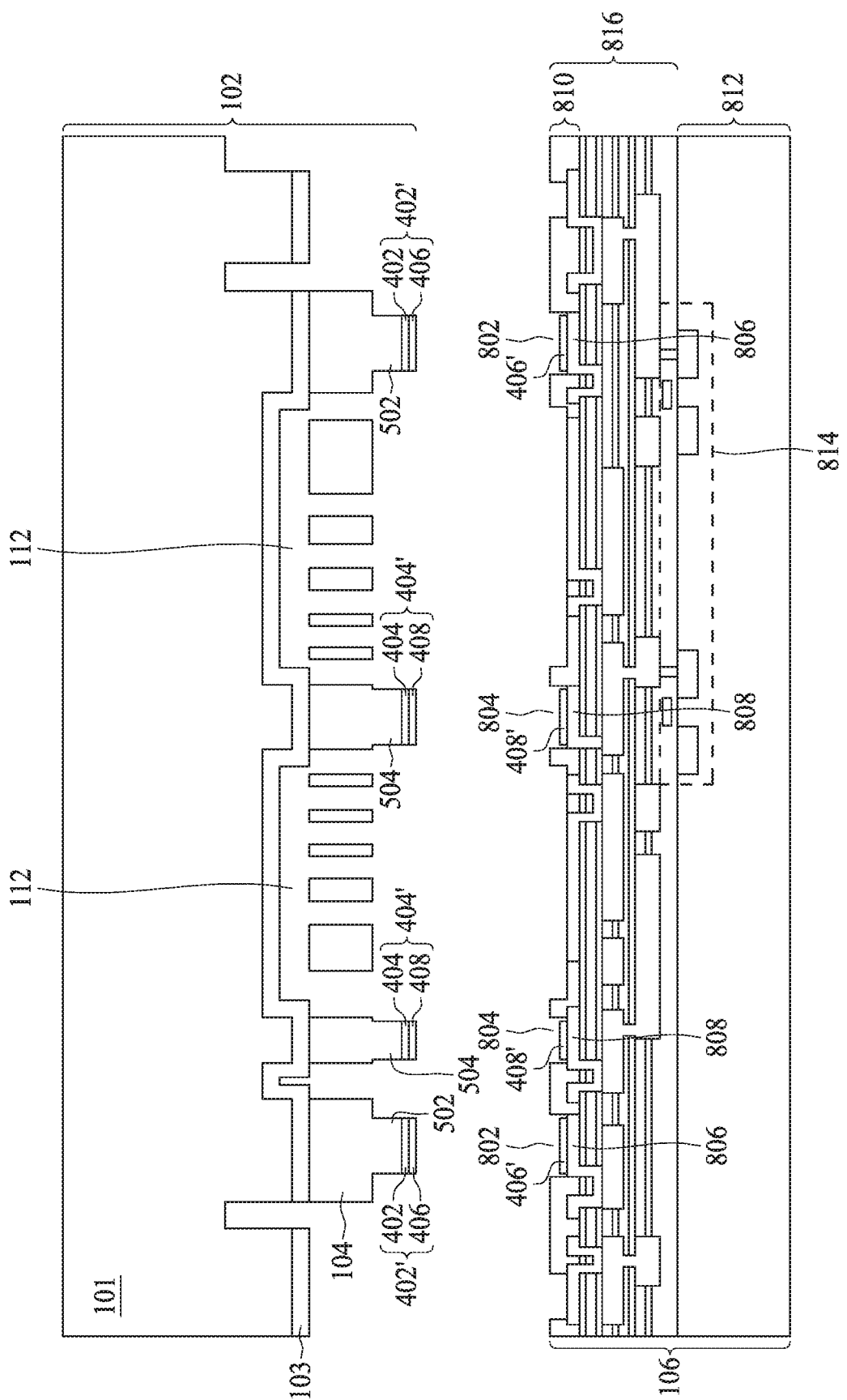
Figure 8C:
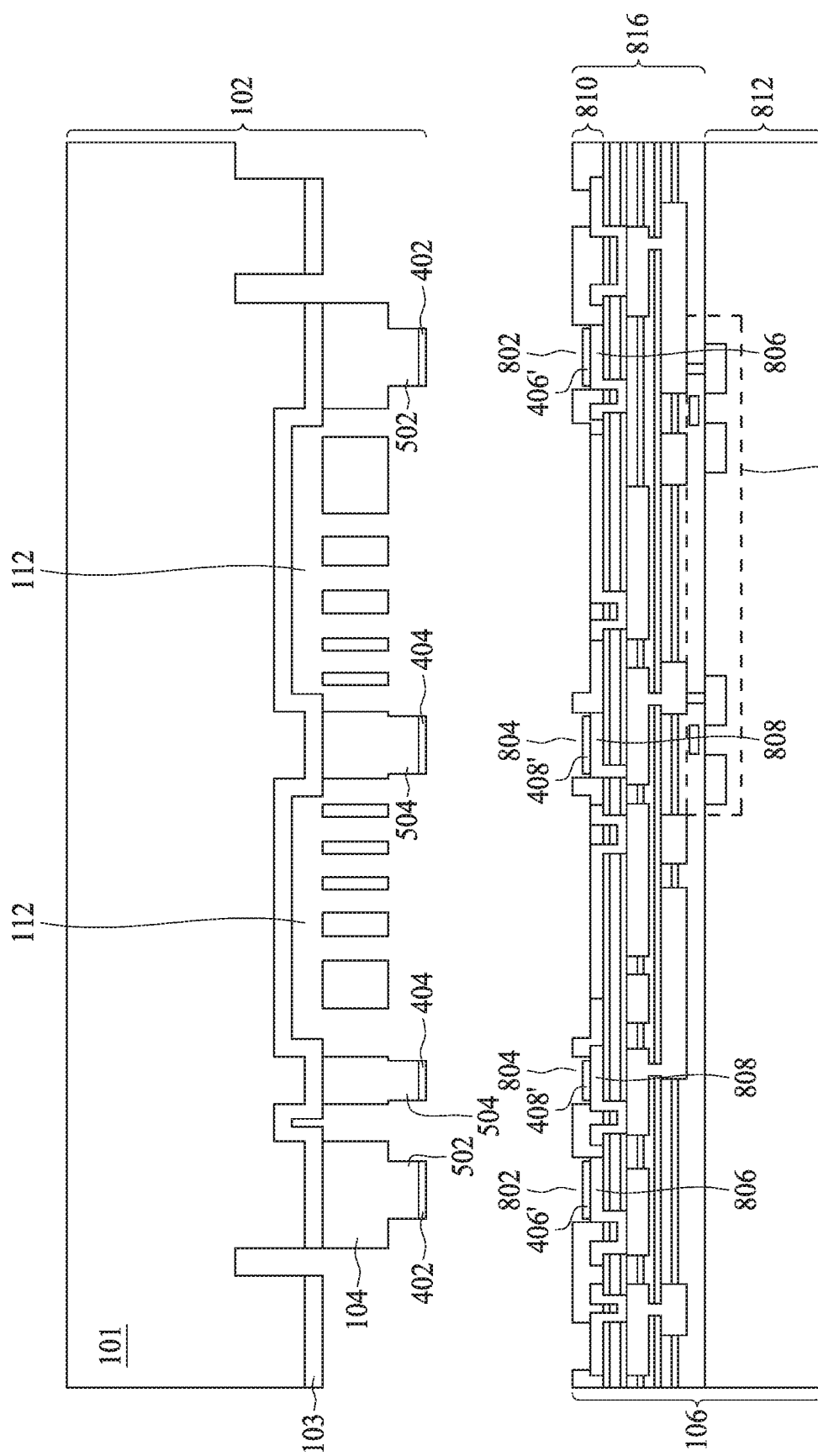

In some other embodiments, another metal layer different from the bonding metal of the bonding regions 806 and 808 is further formed on the bonding regions 806 and 808 for eutectic bonding. The metal layer form on the bonding regions 806 and 808 includes the metal the same with that of the metal layers 406 and 408. One embodiment is illustrated in FIG. 8B, wherein metal layers 406' and 408' are electroplated onto the bonding regions 806 and 808 respectively. In still some other embodiments, the same or similar to FIG. 8B, another metal layer different from the bonding metal of the bonding regions 806 and 808 is further formed on the bonding regions 806 and 808 for eutectic bonding, but the metal layers 406 and 408 of FIG. 8B is omitted. One embodiment is illustrated in FIG. 8C, wherein Sn layers 406' and 408' are electroplated onto the bonding regions 806 and 808 respectively, and the bonding regions of the sensing substrate 104 includes only the metal layers 402 and 404.

Thereafter, the bonding regions 402' and 404' (or the metal layer 402 and 404 for FIG. 8C) of the ESOI substrate 102 is brought in contact with the bonding regions 806 and 808 (or the metal layers 406' and 408' for FIGS. 8B and 8C) through the openings 802 and 804 of the CMOS wafer 106. During the bonding, both the ESOI substrate 102 and the CMOS wafer 106 are heated, and a pressing force is applied to press the ESOI substrate 102 and the CMOS wafer 106 against each other when the temperature is elevated. In other words, the bonding interface between the ESOI substrate 102 and the CMOS wafer 106 is subjected to heat and a pressing force in order to reflow the metal comprised in the bonding regions 402' and 404' (or the metal layer 402 and 404 for FIG. 8C) and the corresponding bonding regions 806 and 808 and the metal layers 406' and 408' for FIGS. 8B and 8C) of the CMOS wafer 106. The pressing force is applied on the ESOI substrate 102 against the CMOS wafer 106, and/or on the CMOS wafer 106 against the ESOI substrate 102 so as to create hermetic seals.

Reflow of the metal results in a fused bond structure that provides an ohmic contact between the ESOI substrate 102 and the CMOS wafer 106. In the exemplary embodiment, the bond between the ESOI substrate 102 and the CMOS wafer 106 includes a Cu—Sn eutectic bond. This eliminates the need for providing a separate electrical path for the signals between the sensing substrate and the CMOS wafer 106. Eutectic reactions are a triple point in the phase diagram where solid alloys mixtures transform directly to a liquid phase. The eutectic melting temperature for the Cu—Sn bond is about 231 degrees Celsius, in order to ensure an adequate or sufficient eutectic reaction for the Cu—Sn bond, a bonding temperature provided during the eutectic bonding process may be higher than the eutectic temperature. In this embodiment, a bonding temperature provided during the eutectic bonding process may be in a range from about 240 degrees Celsius to about 300 degrees Celsius with a pressing force being about 1 MPA to about 2 MPa per unit area or below. However, this is not a limitation of the present disclosure.

Compared with existing eutectic bonds, the disclosed Cu—Sn eutectic bond has a lower bonding temperature and a lower bonding pressing force by using a Cu—Sn eutectic bond. In particular, some existing eutectic bonds including the Au—In bond, the Au—Sn bond, the Au—Ge bond, the Au—Si bond, and the Al—Ge bond, wherein the Au—Sn bond, the Au—Ge bond, the Au—Si bond, and the Al—Ge bond all requires a high bonding temperature. The Au—Sn bond has a eutectic melting temperature of about 280 degrees Celsius, and requires a bonding temperature in a range of about 280 degrees Celsius to about 310 degrees Celsius. The Au—Ge bond has a eutectic melting temperature of about 361 degrees Celsius, and requires a bonding temperature in a range of about 380 degrees Celsius to about 400 degrees Celsius. The Au—Si bond has a eutectic melting temperature of about 363 degrees Celsius, and requires a bonding temperature in a range of about 390 degrees Celsius to about 415 degrees Celsius. The Al—Ge bond has a eutectic melting temperature of about 419 degrees Celsius, and requires a bonding temperature in a range of about 430 degrees Celsius to about 450 degrees Celsius.

Figure 9:
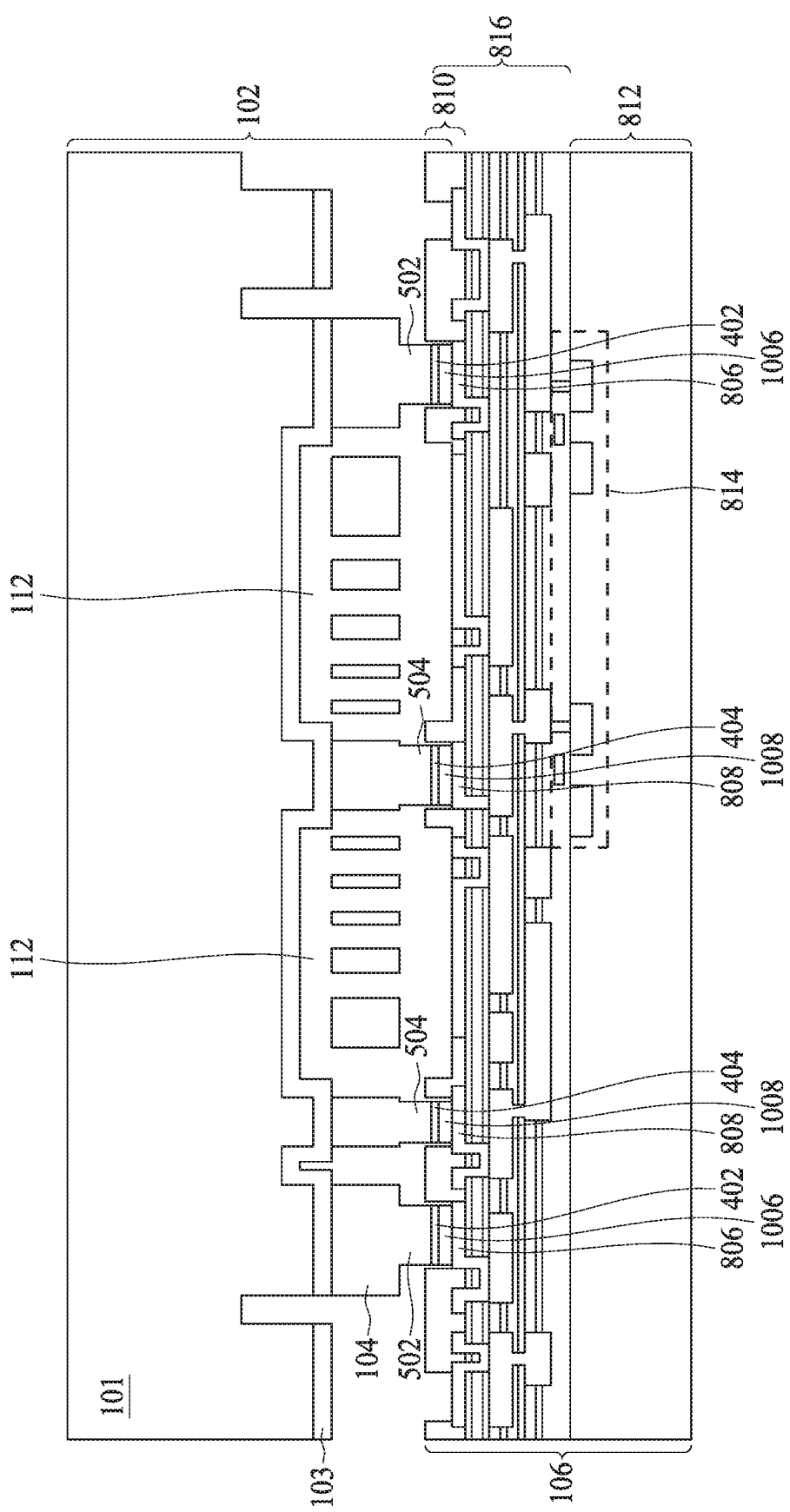

For the embodiment configured as FIG. 8A, an alloy 1006 in FIG. 9 is formed by the metal layer 406 and at least a portion of the metal layers 402 and 806; and similarly, an alloy 1008 is formed by the metal layer 408 and at least a portion of the metal layers 404 and 808. For the embodiment configured as FIG. 8B, an alloy 1006 in FIG. 9 is formed by the metal layers 406, 406' and at least a portion of the metal layers 402 and 806; and similarly, an alloy 1008 is formed by the metal layers 408, 408' and at least a portion of the metal layers 404 and 808. For the embodiment configured as FIG. 8C, an alloy 1006 in FIG. 9 is formed by the metal layer 406' and at least a portion of the metal layers 402 and 806; and similarly, an alloy 1008 is formed by the metal layer 408' and at least a portion of the metal layers 404 and 808. In particular, the metal layers 406, 408, 406' and 408' are substantially fully reacted with the above or beneath metal layers 402, 404, 806 and 808.

Upon cooling, a microstructure is formed as shown in FIG. 9, which is both strong and hermetic. Eutectic metal compositions have several benefits as sealing materials, including the ability to accurately deposit and define the metals in desired patterns, the tolerance to surface deviations, roughness and particulates, plus metals' inherent hermeticity and conductivity. Hermeticity, the degree of air tightness for a vessel or package, is useful for MEMS packages because the mechanical and electrical functionality of the device within the package typically relies on critical environmental control. Change in the atmosphere inside the package can bring about a shift in performance or even a total failure of the device.

For the embodiment configured as FIG. 8A, an alloy 1006 in FIG. 9 is formed by the metal layer 406 and at least a portion of the metal layers 402 and 806; and similarly, an alloy 1008 is formed by the metal layer 408 and at least a portion of the metal layers 404 and 808. For the embodiment configured as FIG. 8B, an alloy 1006 in FIG. 9 is formed by the metal layers 406, 406' and at least a portion of the metal layers 402 and 806; and similarly, an alloy 1008 is formed by the metal layers 408, 408 'and at least a portion of the metal layers 404 and 808. For the embodiment configured as FIG. 8C, an alloy 1006 in FIG. 9 is formed by the metal layer 406' and at least a portion of the metal layers 402 and 806; and similarly, an alloy 1008 is formed by the metal layer 408' and at least a portion of the metal layers 404 and 808. In particular, the metal layers 406, 408, 406' and 408' are substantially fully reacted with the above or beneath metal layers 402, 404, 806 and 808.

In the exemplary embodiment, the alloys 1006 and 1008 include Cu3Sn. Some unreacted Cu remained after the bonding is acceptable. But any unreacted Sn remained after the bonding is not desired because Sn is less stable than Cu and Cu3Sn. In order to fully consume Sn in the metal layers 406, 408, 406' and 408', a thickness of the metal layers 406, 408, 406' and 408' may be predetermined in accordance with a thickness of the metal layers 402, 404, 802 and 804 above or beneath the metal layers 406, 408, 406' and 408'.

Figure 10:
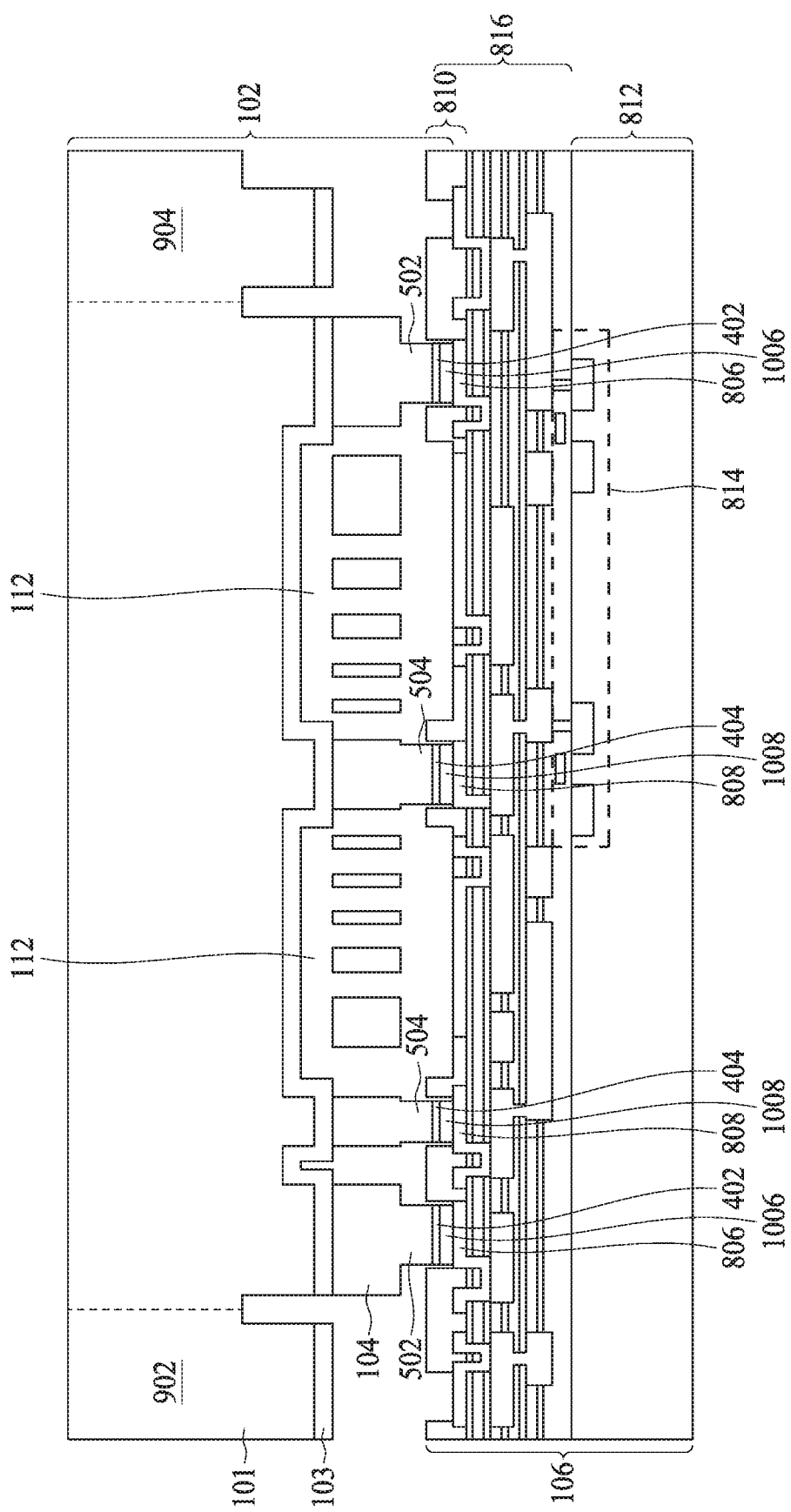
Figure 11:
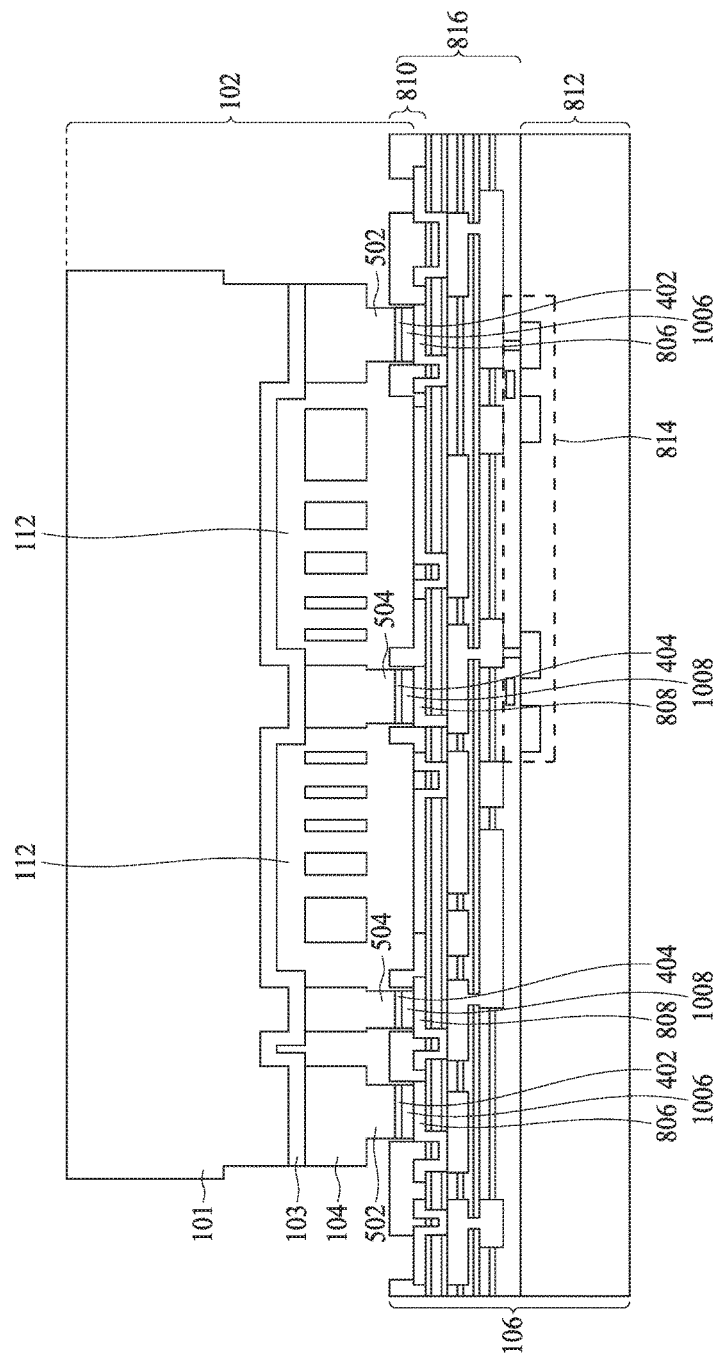

In a subsequent step, a pad opening step is performed. Portions 902 and 904 of the cap substrate 101 are removed as shown in FIG. 10, for example, in an etching step or a grind-open step. The resulting structure is shown in FIG. 11. Bond pads 1002 and 1004 in CMOS substrate 106 are hence no longer covered by the ESOI substrate 102. Bond pads 1002 and 1004 are exposed from CMOS substrate 106 in order to receive external bonding or wiring. In some embodiments, the etching is anisotropic, and hence edges of the cap substrate 101 of FIG. 11 are substantially straight. Alternatively, the portions 902 and 904 can be removed by a grind-open step, wherein a grinding wheel or blade is used to erase the portions 902 and 904. In some embodiments, the sensing substrate 104 may be thinned using a grinding and/or other thinning process to achieve a desired thickness before the formation of the MEMS-device-comprising package is finished.

The present disclosure provides a method for producing an improved bond of wafer level package (WLP) that has been widely used in three-dimensional (3D) IC, chip scale package (CSP) and MEMS device assembly. However, the disclosed bond and associated method are not limited to the WLP or the 3D IC, CSP and MEMS device. The disclosed bonding process can be integrated into the standard CMOS process, thus yielding a simplified, low cost solution. Compared with existing eutectic bonds, the disclosed Cu—Sn eutectic bond has a lower bonding temperature and a lower bonding pressing force by using a Cu—Sn eutectic bond.

Some embodiments of the present disclosure provide a packaging method. The packaging method includes: providing a first semiconductor substrate; forming a bonding region on the first semiconductor substrate, wherein the bonding region of the first semiconductor substrate includes a first bonding metal layer and a second bonding metal layer; providing a second semiconductor substrate having a bonding region, wherein the bonding region of the second semiconductor substrate includes a third bonding layer; and bonding the first semiconductor substrate to the second semiconductor substrate by bringing the bonding region of the first semiconductor substrate in contact with the bonding region of the second semiconductor substrate; wherein the first and third bonding metal layers include copper Cu), and the second bonding metal layer includes Tin (Sn).

Some embodiments of the present disclosure provide a packaging method. The packaging method includes: providing a first semiconductor substrate; forming a bonding region on the first semiconductor substrate, wherein the bonding region of the first semiconductor substrate includes a first bonding metal layer; providing a second semiconductor substrate having a bonding region, wherein the bonding region of the second semiconductor substrate includes a second bonding layer; bonding the bonding region of the first semiconductor substrate with the bonding region of the second semiconductor substrate by utilizing an ancillary bonding metal; and applying a pressing force being about 1 MPA to about 2 MPa per unit area or below in order to press the first and second semiconductor substrates against each other.

Some embodiments of the present disclosure provide packaging structure. The packaging structure includes a first semiconductor substrate having a first bonding region thereon; and a second semiconductor substrate having a second bonding region thereon; wherein the first bonding region is bonded with the second bonding region, and a bonding interface between the first and second bonding regions includes Cu3Sn.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A packaging structure, comprising:
    a first semiconductor substrate having a first semiconductor portion that is disposed over and extends from a second semiconductor portion, wherein a first width of the first semiconductor portion is less than a second width of the second semiconductor portion;
    a second semiconductor substrate having a dielectric layer and a first copper bonding layer, wherein a bonding area of the second semiconductor substrate is defined by a first sidewall of the dielectric layer, a second sidewall of the dielectric layer, and the first copper bonding layer, and further wherein the first copper bonding layer is disposed in and physically contacts the dielectric layer, the first copper bonding layer extends from the first sidewall of the dielectric layer to the second sidewall of the dielectric layer, a topmost surface of the dielectric layer is higher than a topmost surface of the first copper bonding layer, a third width is defined between the first sidewall of the dielectric layer and the second sidewall of the dielectric layer;
    a bonding interface layer disposed directly on and physically contacting the first copper bonding layer and further disposed between the first sidewall of the dielectric layer and the second sidewall of the dielectric layer, wherein the bonding interface layer includes $Cu_3Sn$, a topmost surface of the bonding interface layer is lower than the topmost surface of the dielectric layer, and a fourth width of the bonding interface layer is less than the third width defined between the first sidewall of the dielectric layer and the second sidewall of the dielectric layer, such that the bonding interface layer is spaced away from and does not physically contact the first sidewall and the second sidewall of the dielectric layer;
    a second copper bonding layer disposed directly on and physically contacting the bonding interface layer and further disposed between the first sidewall of the dielectric layer and the second sidewall of the dielectric layer, wherein the second copper bonding layer is disposed between the first semiconductor portion of the first semiconductor substrate and the bonding interface layer, and further wherein a fifth width of the second copper bonding layer is less than the third width defined between the first sidewall of the dielectric layer and the second sidewall of the dielectric layer, such that the second copper bonding layer is spaced away from and does not physically contact the first sidewall and the second sidewall of the dielectric layer;
    wherein each of the fourth width of the bonding interface layer and the fifth width of the second copper bonding layer is substantially the same as the first width of the first semiconductor portion of the first semiconductor substrate; and
    wherein the first copper bonding layer, the bonding interface layer, and the second copper bonding layer form a bonding structure that attaches the first semiconductor substrate to the second semiconductor substrate and provides an electrical path between a first device of the first semiconductor substrate and a second device of the second semiconductor substrate.

2. The packaging structure of claim 1, wherein a sixth width of the first copper bonding layer is greater than the fourth width of the bonding interface layer and the fifth width of the second copper bonding layer.

3. The packaging structure of claim 1, wherein the first device is a MEMs device and the second device is a transistor.

4. The packaging structure of claim 3, wherein the first semiconductor portion of the first semiconductor substrate is disposed between the first sidewall of the dielectric layer and the second sidewall of the dielectric layer, and further wherein the first width of the first semiconductor portion of the first semiconductor substrate is less than the third width defined between the first sidewall of the dielectric layer and the second sidewall of the dielectric layer, such that first semiconductor portion is spaced away from and does not physically contact the first sidewall and the second sidewall of the dielectric layer.

5. The packaging structure of claim 1, wherein the dielectric layer and the first copper bonding layer are a portion of a multi-layer interconnect structure of the second semiconductor substrate.

6. The packaging structure of claim 1, wherein a thickness of the bonding interface layer is greater than a thickness of the second copper bonding layer.

7. The packaging structure of claim 1, wherein a topmost surface of the second copper bonding layer is lower than the topmost surface of the dielectric layer.

8. A device comprising:
    a MEMS wafer having a first surface and a second surface opposite the first surface, wherein a first bonding mesa and a second bonding mesa protrude from the first surface of a first portion and a second portion, respectively, of the MEMS wafer and a MEMS device of the MEMS wafer is disposed between the first bonding mesa and the second bonding mesa;
    a transistor wafer having a third surface and a fourth surface opposite the third surface, wherein a multilayer interconnect (MLI) is disposed over the third surface of the transistor wafer; and
    an eutectic bonding structure that attaches the first bonding mesa and the second bonding mesa to the MLI and provides an electrical path between the transistor wafer and the MEMS device, wherein the first bonding mesa and the second bonding mesa protrude from the first surface of the first portion and the second portion, respectively, of the MEMS wafer towards the third surface of the transistor wafer, wherein the eutectic bonding structure includes:
        a patterned first copper layer,
        a patterned second copper layer, and
        an eutectic alloy layer disposed between and physically contacting the first patterned copper layer and the second patterned copper layer, wherein the eutectic alloy layer includes copper (Cu) and tin (Sn), wherein the first patterned copper layer is disposed between topmost surfaces of the first bonding mesa and the second bonding mesa and the eutectic alloy layer and the second patterned copper layer is disposed between a first metal layer and a second metal layer of the MLI and the eutectic alloy layer.

9. The device of claim 8, wherein:
    a first width of the first patterned copper layer disposed between the topmost surface of the first bonding mesa and the eutectic alloy layer is substantially the same as a second width of the first bonding mesa; and
    a third width of the first patterned copper layer disposed between the topmost surface of the second bonding mesa and the eutectic alloy layer is substantially the same as a fourth width of the second bonding mesa.

10. The device of claim 8, wherein:
a first width of the first bonding mesa is less than a second width of the first portion of the MEMS wafer from which the first bonding mesa protrudes from the first surface; and; and
a third width of the second bonding mesa is less than a fourth width of the second portion of the MEMS wafer from which the second bonding mesa protrudes from the first surface.

11. The device of claim 8, further comprising a cap substrate attached to the second surface of the MEMS wafer by a dielectric layer.

12. The device of claim 8, wherein the eutectic alloy layer is free of unreacted Sn.

13. The device of claim 8, wherein the second patterned copper layer is a portion of the MLI, wherein the second patterned copper layer is disposed within a topmost dielectric layer of the MLI, and wherein a top surface of the second patterned copper layer is lower than a top surface of the topmost dielectric layer of the MLI.

14. The device of claim 8, wherein the eutectic bonding structure further includes a titanium layer disposed between the patterned first copper layer and the topmost surfaces of the first bonding mesa and the second bonding mesa.

15. A device comprising:
an engineered silicon-on-insulator (ESOI) wafer that includes:
a cap substrate, and
a sensing substrate attached to the cap substrate by fusion bonding, wherein
the sensing substrate includes a MEMS device disposed between a first bonding mesa and a second bonding mesa extending from the sensing substrate; and
a complementary metal-oxide-semiconductor (CMOS) wafer that includes a transistor and a multilayer interconnect (MLI) disposed over the transistor, wherein the CMOS wafer is attached to the ESOI wafer by eutectic bonding, wherein the eutectic bonding is achieved by:
a first metal bonding layer disposed on the first bonding mesa and a second metal bonding layer disposed on the second bonding mesa,
a third metal bonding layer and a fourth metal bonding layer that are a portion of the MLI of the CMOS wafer, and
a metal alloy bonding interface layer disposed between the first metal bonding layer and the third metal bonding layer and the second metal bonding layer and the fourth metal bonding layer, wherein the metal alloy bonding interface layer is a $Cu_3Sn$ layer.

16. The device of claim 15, wherein the first metal bonding layer, the second metal bonding layer, the third metal bonding layer, and the fourth metal bonding layer include the same material.

17. The device of claim 15, wherein the first metal bonding layer and the second metal bonding layer each include a titanium layer disposed directly on the first bonding mesa and the second bonding mesa, respectively, and a copper layer disposed directly on the titanium layer, such that the copper layer physically contacts the titanium layer and the metal alloy bonding interface layer.

18. The device of claim 15, wherein the metal alloy bonding interface layer is free of unreacted Sn.

19. The device of claim 15, wherein the second metal bonding layer is a topmost conductive layer of the Mil of the CMOS wafer.

20. The device of claim 15, further comprising:
a third bonding mesa and a fourth bonding mesa that interpose the first bonding mesa and the second bonding mesa, wherein the eutectic bonding is further achieved by:
a fifth metal bonding layer disposed on the third bonding mesa and a sixth metal bonding layer disposed on the second bonding mesa,
a seventh metal bonding layer and an eighth metal bonding layer that are a portion of the MLI of the CMOS wafer, and
wherein the metal alloy bonding interface layer is further disposed between the fifth metal bonding layer and the seventh metal bonding layer and the sixth metal bonding layer and the eighth metal bonding layer.

\* \* \* \* \*